(12) United States Patent
Yu

(10) Patent No.: US 7,713,860 B2
(45) Date of Patent: May 11, 2010

(54) METHOD OF FORMING METALLIC BUMP ON I/O PAD

(76) Inventor: Wan-Ling Yu, 11F-6, No. 165, Sec. 5, Ming-Sheng E. Road, Taipei (TW)

( * ) Notice: Subject to any disclaimer, the term of this patent is extended or adjusted under 35 U.S.C. 154(b) by 0 days.

(21) Appl. No.: 11/871,974

(22) Filed: Oct. 13, 2007

(65) Prior Publication Data
US 2009/0098723 A1   Apr. 16, 2009

(51) Int. Cl.
  *H01L 21/44* (2006.01)
(52) U.S. Cl. ............... 438/613; 438/612; 438/614; 438/615; 438/616; 438/617; 257/673; 257/737; 257/772; 257/779; 257/738; 257/E21.508; 257/E23.021; 257/E23.033
(58) Field of Classification Search ........... 438/612, 438/613, 614, 615, 616, 617; 257/673, 737, 257/772, 779, 738, E21.508, E23.021, E23.033
See application file for complete search history.

(56) References Cited

U.S. PATENT DOCUMENTS

| | | | | |
|---|---|---|---|---|
| 4,742,023 A * | 5/1988 | Hasegawa | ............... | 438/614 |
| 5,293,006 A * | 3/1994 | Yung | ............... | 174/261 |
| 5,418,186 A * | 5/1995 | Park et al. | ............... | 438/614 |
| 5,445,979 A * | 8/1995 | Hirano | ............... | 438/167 |
| 5,492,235 A * | 2/1996 | Crafts et al. | ............... | 438/695 |
| 5,508,229 A * | 4/1996 | Baker | ............... | 438/614 |
| 5,888,892 A * | 3/1999 | Yanagida | ............... | 438/614 |
| 5,895,271 A * | 4/1999 | Hasegawa et al. | ............... | 438/701 |
| 5,933,752 A * | 8/1999 | Yanagida | ............... | 438/613 |
| 5,946,590 A * | 8/1999 | Satoh | ............... | 438/613 |
| 6,117,299 A * | 9/2000 | Rinne et al. | ............... | 205/125 |
| 6,162,652 A * | 12/2000 | Dass et al. | ............... | 438/18 |
| 6,169,021 B1 * | 1/2001 | Akram et al. | ............... | 438/612 |
| 6,268,114 B1 * | 7/2001 | Wen et al. | ............... | 430/314 |
| 6,372,545 B1 * | 4/2002 | Fan et al. | ............... | 438/108 |
| 6,413,851 B1 * | 7/2002 | Chow et al. | ............... | 438/613 |
| 6,426,556 B1 * | 7/2002 | Lin | ............... | 257/738 |
| 6,555,908 B1 * | 4/2003 | Eichelberger et al. | ........ | 257/737 |
| 6,586,322 B1 * | 7/2003 | Chiu et al. | ............... | 438/612 |
| 6,649,533 B1 * | 11/2003 | Iacoponi | ............... | 438/719 |
| 6,667,230 B2 * | 12/2003 | Chen et al. | ............... | 438/613 |
| 6,696,356 B2 * | 2/2004 | Tseng et al. | ............... | 438/612 |
| 6,815,324 B2 * | 11/2004 | Huang et al. | ............... | 438/612 |
| 6,849,534 B2 * | 2/2005 | Ho et al. | ............... | 438/614 |
| 6,878,633 B2 * | 4/2005 | Raskin et al. | ............... | 438/694 |
| 7,007,834 B2 * | 3/2006 | Zakel | ............... | 228/56.3 |
| 7,132,358 B2 * | 11/2006 | Jeong et al. | ............... | 438/614 |
| 7,250,362 B2 * | 7/2007 | Huang | ............... | 438/612 |
| 7,449,785 B2 * | 11/2008 | Jeng et al. | ............... | 257/779 |
| 2002/0003160 A1 * | 1/2002 | Beroz et al. | ............... | 228/180.1 |
| 2002/0020551 A1 * | 2/2002 | Rinne et al. | ............... | 174/261 |

(Continued)

*Primary Examiner*—Fernando L Toledo
*Assistant Examiner*—Ankush k Singal

(57) ABSTRACT

The method mainly contains the following steps. First, an UBM is formed on a top side of a semiconductor's I/O pad. An isolative layer and a metallic foil are sequentially arranged in this order on the UBM. Then, a via is formed to expose the top surface of the UBM. Subsequently, a thin metallic layer is formed in the via and a resist is formed on the metallic foil. Then, by using the metallic foil and the thin metallic layer as an electrode to conduct electrical current, a metallic bump is formed using electroplating in the via on the top side of the UBM. Finally, the resist and the metallic foil are removed and the formation of the metallic bump is completed.

10 Claims, 3 Drawing Sheets

U.S. PATENT DOCUMENTS

| | | | |
|---|---|---|---|
| 2002/0105076 A1* | 8/2002 | Lin | 257/738 |
| 2003/0216039 A1* | 11/2003 | Wang et al. | 438/684 |
| 2004/0115934 A1* | 6/2004 | Broz et al. | 438/689 |
| 2004/0182915 A1* | 9/2004 | Bachman et al. | 228/220 |
| 2004/0247840 A1* | 12/2004 | Sugiura | 428/195.1 |
| 2005/0042872 A1* | 2/2005 | Chien et al. | 438/689 |
| 2005/0116340 A1* | 6/2005 | Shindo | 257/737 |
| 2005/0164483 A1* | 7/2005 | Jeong et al. | 438/612 |
| 2005/0242436 A1* | 11/2005 | Abe et al. | 257/737 |
| 2005/0258539 A1* | 11/2005 | Minda | 257/738 |
| 2005/0272242 A1* | 12/2005 | Tseng et al. | 438/613 |
| 2006/0051954 A1* | 3/2006 | Lin et al. | 438/614 |
| 2006/0134884 A1* | 6/2006 | Lo et al. | 438/460 |
| 2006/0170102 A1* | 8/2006 | Ko | 257/738 |
| 2006/0237842 A1* | 10/2006 | Shindo | 257/737 |
| 2007/0063346 A1* | 3/2007 | Abe et al. | 257/737 |
| 2007/0087544 A1* | 4/2007 | Chang et al. | 438/612 |
| 2007/0130763 A1* | 6/2007 | Hsu et al. | 29/832 |
| 2007/0155155 A1* | 7/2007 | Tanida et al. | 438/614 |
| 2007/0182004 A1* | 8/2007 | Rinne | 257/734 |
| 2007/0182007 A1* | 8/2007 | Jeng et al. | 257/737 |
| 2007/0290343 A1* | 12/2007 | Harada et al. | 257/737 |
| 2008/0050905 A1* | 2/2008 | Uchida et al. | 438/614 |
| 2008/0169559 A1* | 7/2008 | Yang | 257/737 |
| 2009/0057909 A1* | 3/2009 | Strothmann | 257/766 |
| 2009/0096099 A1* | 4/2009 | Hsu | 257/738 |

* cited by examiner

METHOD OF FORMING METALLIC BUMP ON I/O PAD

BACKGROUND OF THE INVENTION

1. Field of the Invention

The present invention generally relates to chip packaging, and more particularly to a method of forming metallic bumps on the I/O pads of a semiconductor device

2. The Prior Arts

Flip-chip packaging utilizes bumps to establish electrical contact between a chip's I/O pads and the substrate (or lead frame) of the package. Structurally, a bump actually contains the bump itself and a so-called under bump metallurgy (UBM) located between the bump and an I/O pad.

An UBM generally contains an adhesion layer usually made of aluminum or chromium, a barrier layer usually made of copper, lead, or platinum, and a wetting layer usually made of gold, arranged in this order on the I/O pad. The bumps themselves, based on the material used, are classified as solder bumps and gold bumps.

To form solder bumps on the UBMs, usually either electroplating or printing method is used. For electroplating, patterned resists are first formed on the UBMs and then solders are plated. For printing, solders are first printed on the UBMs and the solders are thermally cured into the bumps. The two methods, however, all suffer disadvantages such as excessive bubbles, easy to peel off, etc and the production yield is therefore limited.

Electroplating similar to that used for solder bumps is also usually used to form gold bumps on UBMs so as to facilitate the subsequent Tape Carrier Package (TCP) or Chip On Glass (COG) process. Another method is to use a specialized wire bonding apparatus capable of melting gold wire into ball shape to perform bonding on the UBMs several times until the gold bumps reach a required height. Gold bumping, however, is not widely popular due to its high cost.

SUMMARY OF THE INVENTION

Therefore, a method of forming metallic bumps on I/O pads is provided herein. A major objective of the present invention is that the bumps can be formed using one or more materials selected from a large collection of highly conductive metallic materials. Another major objective of the present invention is to achieve enhanced bonding between the metallic bumps and the I/O pads, instead of relying on the UBMs alone.

To achieve the foregoing objectives, the method mainly contains the following steps. First, an UBM is formed on a top side of a semiconductor device's I/O pad. An isolative layer and a metallic foil are sequentially arranged in this order on the UBM. Then, a via is formed to expose the top surface of the UBM. Subsequently, a thin metallic layer is formed in the via and a resist is formed on the metallic foil. Then, by using the metallic foil and the thin metallic layer to conduct electrical current, a metallic bump is formed using electroplating in the via on the top side of the UBM. Finally, the resist and the metallic foil are removed and the formation of the metallic bump is completed.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENT

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1A:
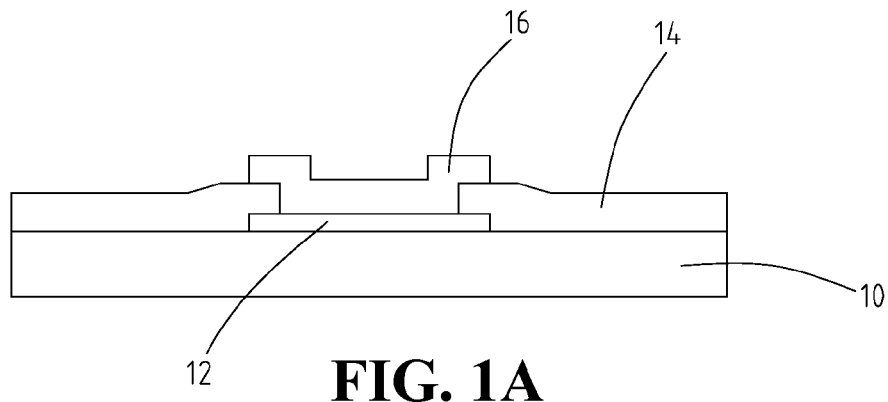
FIGS. 1A to 1H show the various steps of a method of forming a metallic bump on an I/O pad according to an embodiment of the present invention.

FIGS. 1A to 1H show the various steps of a method of forming a metallic bump on an I/O pad according to an embodiment of the present invention. As shown in FIG. 1A, an I/O pad 12 is located on a side of a semiconductor device 10 which can be an integrated circuit (IC), a transistor, a diode, or a thyristor. For ease of reference, this side is referred to as the top side of the semiconductor device 10. Also on the top side of the semiconductor device 10 is an optional passivation layer 14 which exposes part of the top surface of the I/O pad 12. Then, an UBM 16 is formed to entirely cover the exposed top surface of the I/O pad 12 and part of the passivation layer 14 that is also on the top side of the I/O pad 12. The formation of the UBM 16 and the passivation layer 14 is conducted using any appropriate prior art technique. This should be well known to a skilled artisan in the related art and the details are therefore omitted here.

Figure 1B:
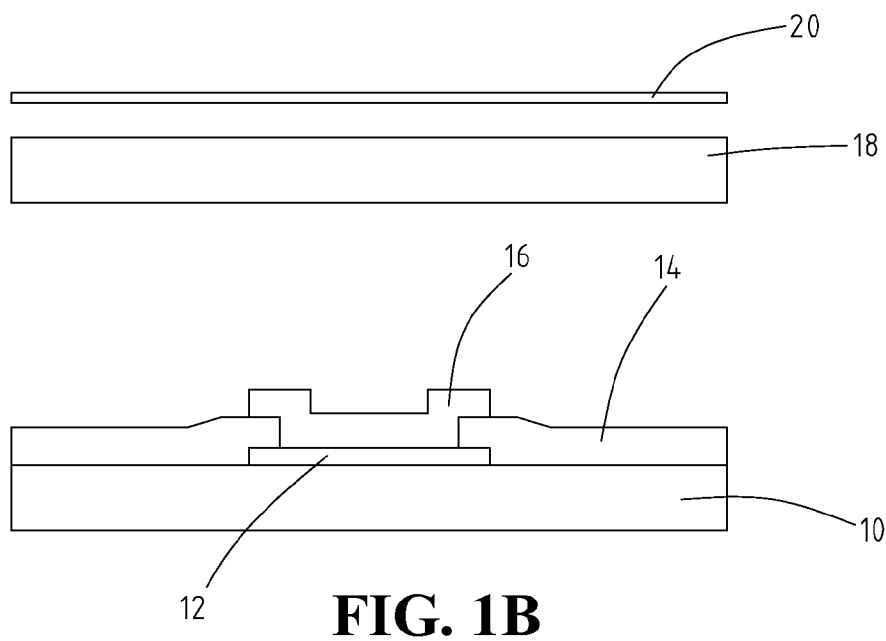
Figure 1C:
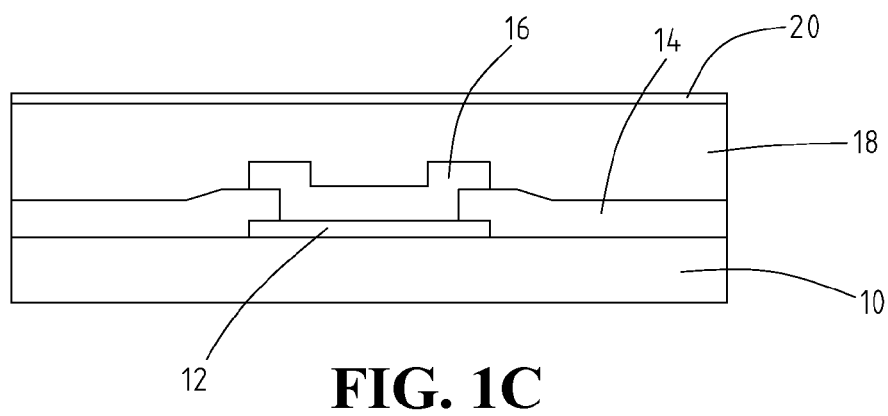

Then, according to the present embodiment, an isolative layer 18 and a metallic foil 20 are provided as shown in FIG. 1B. The isolative layer 18 and the metallic foil 20 are arranged sequentially in this order on the top side of the structure of FIG. 1A and the result is shown in FIG. 1C.

The material for the isolative layer 18 is one such that the isolative layer 18 is in a liquid state or in a temporarily solid state within a specific temperature range. Then, by applying appropriate heat and pressure through the metallic foil 20 to the isolative layer 18 in the liquid state or in the temporarily solid state, the isolative layer 18 is permanently solidified and thereby tightly joined to the structure of FIG. 1A. If an isolative material with temporarily solid state is chosen, the isolative material should be able to turn into liquid state again within a certain temperature range while temperature is rising but before the permanently solidified state is reached. Alternatively, the metallic foil 20 can be attached to the isolative layer 18 first and, the combination is then attached to the top side of the structure of FIG. 1A. Subsequently, by applying appropriate heat and pressure to the isolative layer 18, it is permanently solidified, thereby tightly joined to the structure of FIG. 1A. The metallic foil 20 can be a copper foil, an aluminum foil, or a tin foil.

Figure 1D:
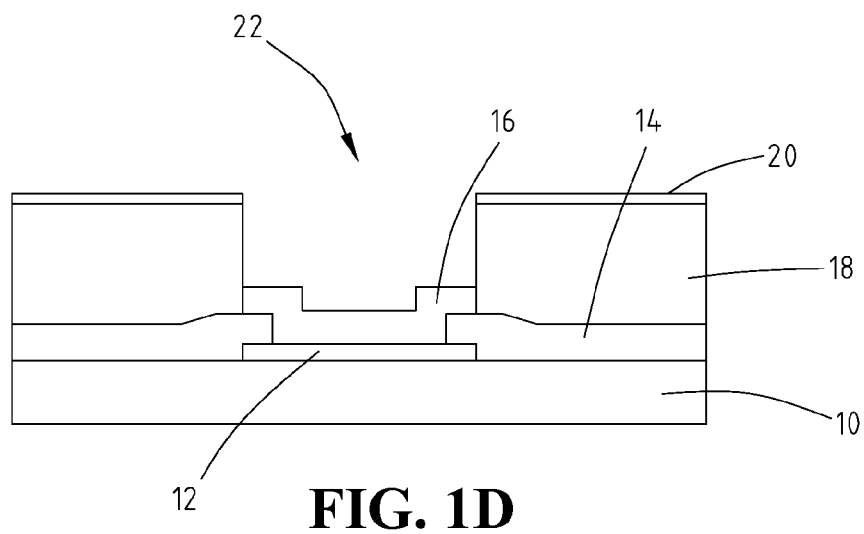

Then, the part of the metallic foil 20 directly covering the UBM 16 is removed by laser ablation or chemical etching first and then the isolative layer 18 on the top side of the UBM 16 is removed by laser ablation or lithographic means. As such, the via 22 is formed and the UBM 16 is thereby exposed, as shown in FIG. 1D.

Figure 1E:
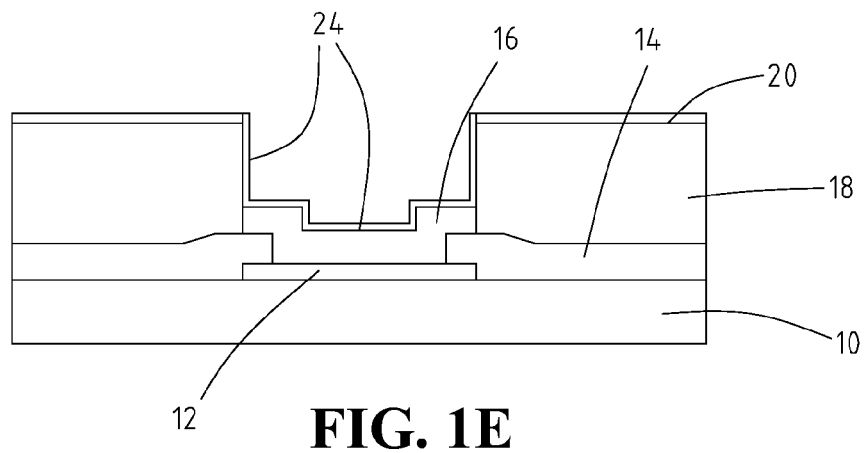
Figure 1F:
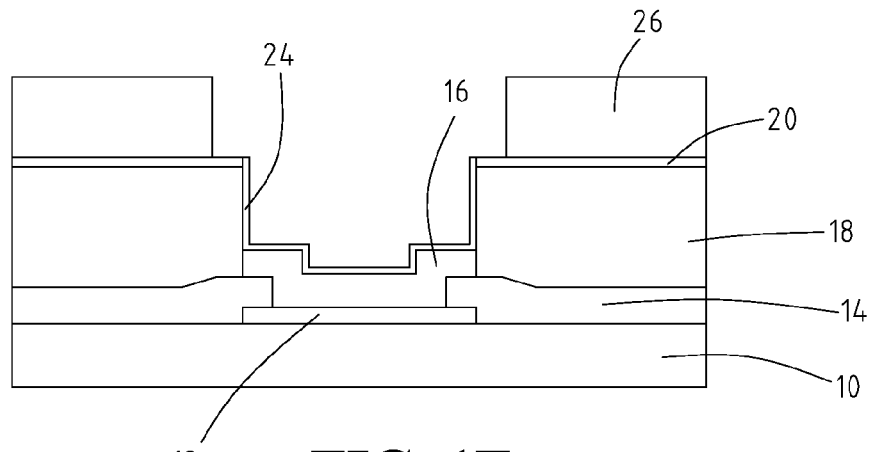
Figure 1G:
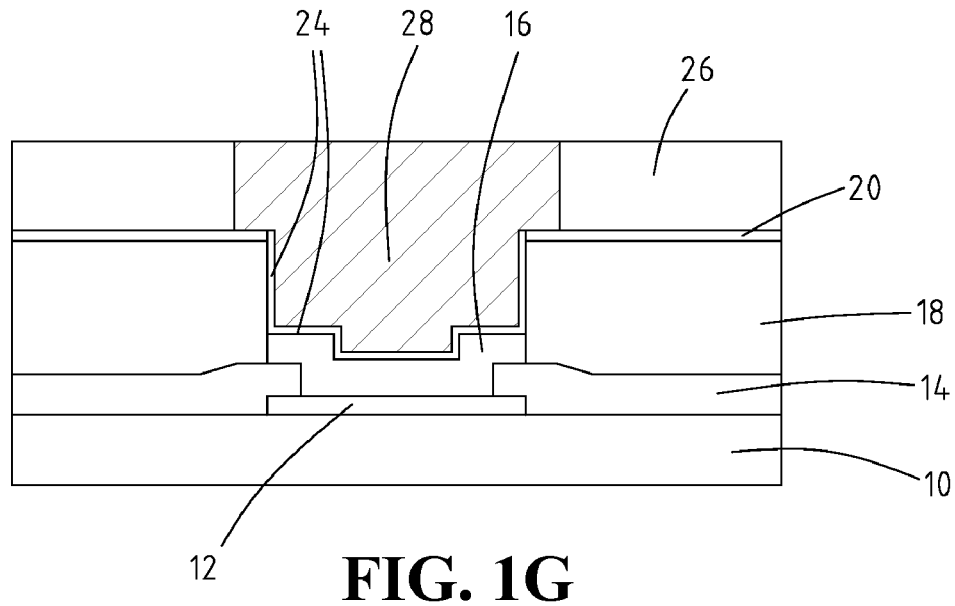
Figure 1H:
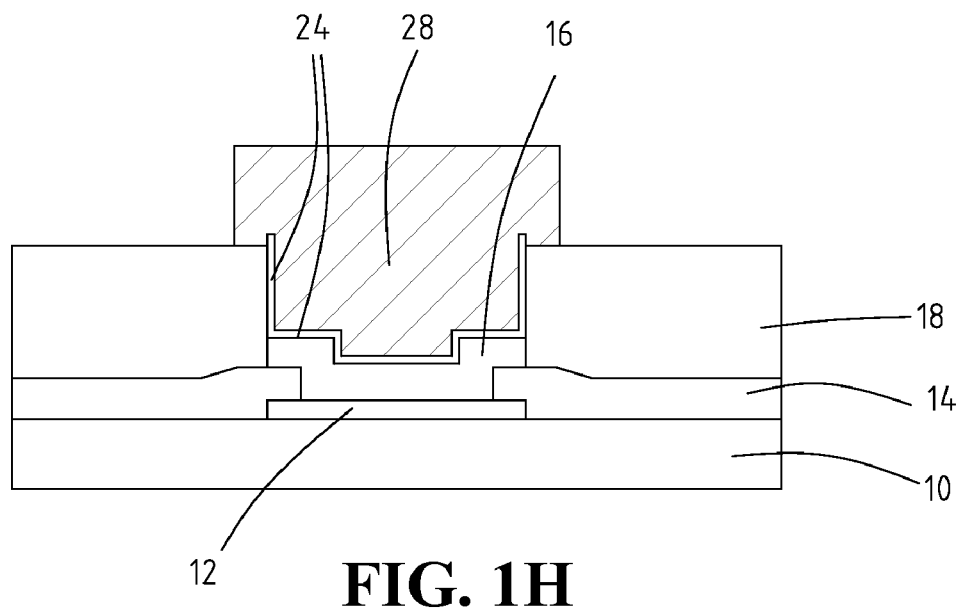

Subsequently, a thin metallic layer 24 using electroless copper or nickel is formed at least in the via 22 using electroless deposition or sputtering, as shown in FIG. 1E. For enhanced reliability, optionally an additional metallic layer could be further formed by electroplating on the external surface of the thin metallic layer 24. Then, a resist 26 is formed on a top side of the metallic foil 20, without covering the via 22 coated with the thin metallic layer 24. As such, the metallic foil 20 and the thin metallic layer 24 can jointly function as an electrode to conduct electrical current to form a metallic bump 28 in the via 22 on the top side of the UBM 16 using electroplating, as shown in FIG. 1G. Please note that, depending on the requirements of the subsequent packaging process, the metallic bump 28 can be either a solid one or a hollow one; and the metallic bump 28 can be formed to have a cylindrical body with a circular, rectangular, triangular, diamond-shaped, star-shaped, or polygonal cross section or with a cross section having two or more of the above shapes combined. Finally, as shown in FIG. 1H, the resist 26 is removed and, by using laser or chemical etching, the metallic foil 20 is removed from both sides of the metallic bump 28 while a portion of the metallic foil 20 remains under the metallic bump 28. Surface of copper bump can be coated with OSP (Organic Surface Protection), ENIG (Electroless Nickel Immersion Gold), Immersion Tin or Immersion Silver. The formation of the metallic bump 28 is therefore completed. Please note that, the height of the metallic bump 28 can be controlled by having the resist 26 to be of an appropriate height.

In an alternative embodiment where the isolative layer 18 in the liquid state is applied to the structure of FIG. 1A without the metallic foil 20, the isolative layer 18 can be solidified into the temporarily solid state first and the via 22 exposing the UBM 16 is formed using laser or lithographic means. Then, the metallic foil 20 is attached to the temporarily solidified isolative layer 18 and solidified permanently, and after part of metallic foil 20 on top of via 22 is removed by chemical etching or laser ablation the result is the same as what is shown in FIG. 1D. The same subsequent steps as described above can be conducted to form the metallic bump 28.

In yet another alternative embodiment where the metallic foil 20 is not used at all, the isolative layer 18 is applied to the structure of FIG. 1A and solidified. Then, the via 22 exposing the UBM 16 is formed using laser ablation or lithographic means. The thin metallic layer 24 is subsequently formed on the top side of the isolative layer 18 and in the via 22 by sputtering or electroless deposition. The thin metallic layer 24 is then thickened to achieve better conductivity by electroplating and the result would be similar to what is shown in FIG. 1E. The same subsequent steps as described above can be conducted to form the metallic bump 28.

To form the via 22 so that it exposes the UBM 16 precisely, the location of the UBM 16 has to be determined first. To achieve that, fiducial marks can be prepared in advance on the bottom side of the semiconductor device 10. Then, by inspecting the positions of the fiducial marks and their positional relationship to the I/O pad 12, the exact location of the UBM 16 can be determined. An alternative approach is to utilize an X-ray apparatus that can "see" through the metallic foil 20 of FIG. 1C to directly determine the exact location of the UBM 16.

The most significant features of the present invention are as follows. First, instead of only gold and solder, an element selected from a large collection of highly conductive metallic materials such as gold, silver, copper, tin, etc. or an alloy of these highly conductive metallic materials can be used to form the metallic bump 28 through electroless deposition and electroplating. Secondly, the metallic bump 28's bonding to the I/O pad 12 is not solely relied on the adhesion between the metallic bump 28 and the UBM 16. According to the present invention, the isolative layer 18 provides additional adhesion, thereby achieving a superior bonding between the metallic bump 28 and the I/O pad 12.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of forming a metallic bump for establishing electrical contact to an I/O pad of a semiconductor device, comprising the steps of:
   preparing said semiconductor device having at least said I/O pad for electrical connection;
   forming an under bump metallurgy (UBM) on a top side of said I/O pad for electrical connection to said I/O pad;
   forming an isolative layer and a metallic foil sequentially in this order on a top side of said semiconductor device to cover said UBM entirely;
   forming a via by removing a part of said isolative layer and said metallic foil until a substantial part of said top side of said UBM is exposed;
   forming a thin metallic layer at least in said via;
   forming resist on a top side of said metallic foil without covering said via coated with said thin metallic layer;
   forming said metallic bump in said via on said top side of said UBM by using said metallic foil and said thin metallic layer jointly to conduct electrical current; and
   removing said resist and said metallic foil.

2. The method according to claim 1, wherein said semiconductor device is one of an integrated circuit, a transistor, a diode, and a thyristor.

3. The method according to claim 1, wherein said UBM comprises an adhesion layer, a barrier layer, and a wetting layer.

4. The method according to claim 1, wherein said metallic foil is one of a copper foil, an aluminum foil, and a tin foil.

5. The method according to claim 1, wherein said thin metallic layer is made of one of electroless copper and nickel.

6. The method according to claim 1, wherein said metallic bump is made of one of the elements gold, silver, copper, tin, and an alloy of said elements.

7. The method according to claim 1, wherein said bump is one of a solid bump and a hollow bump.

8. The method according to claim 1, wherein said metallic bump has a cylindrical shape having one of a circular, rectangular, triangular, diamond-shaped, star-shaped, and polygonal cross section.

9. The method according to claim 1, further comprising the step of:
   forming an additional metallic layer by electroplating on the external surface of said thin metallic layer before forming said resist.

10. The method according to claim 3, wherein said adhesion layer is made of one of aluminum and chromium; said barrier layer is made of one of copper, lead, and platinum; and said wetting layer is made of gold.

* * * * *